United States Patent
Ohta et al.

(10) Patent No.: US 7,065,116 B2
(45) Date of Patent: Jun. 20, 2006

(54) SEMICONDUCTOR LASER ELEMENT AND MANUFACTURING METHOD FOR THE SAME

(75) Inventors: Masayuki Ohta, Yamtokoriyama (JP); Takahiro Hashimoto, Yamtokoriyama (JP); Yoshinori Ohitsu, Nara (JP); Hiroyuki Tsujii, Kashiba (JP); Satofumi Kinei, Soraku-gun (JP); Noboru Oshima, Nara (JP); Shinji Kaneiwa, Nara (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 10/995,780

(22) Filed: Nov. 22, 2004

(65) Prior Publication Data
US 2005/0111506 A1   May 26, 2005

(30) Foreign Application Priority Data
Nov. 25, 2003  (JP)  ............................. 2003-393994
Nov. 28, 2003  (JP)  ............................. 2003-399833

(51) Int. Cl.
*H01S 5/00*      (2006.01)
(52) U.S. Cl. .................. 372/45.01; 372/46.01
(58) Field of Classification Search ............ 372/45–46, 372/45.01, 46.01
See application file for complete search history.

(56) References Cited

U.S. PATENT DOCUMENTS

| 2002/0187577 | A1* | 12/2002 | Sakata et al. ................. 438/39 |
| 2003/0091082 | A1* | 5/2003 | Fukunaga ..................... 372/45 |
| 2004/0114651 | A1* | 6/2004 | Tanaka et al. ................ 372/46 |

FOREIGN PATENT DOCUMENTS

| JP | 08-250801   | 9/1996  |
| JP | 11-017269   | 1/1999  |
| JP | 11-135884   | 5/1999  |
| JP | 2000-340880 | 12/2000 |
| JP | 2003-046193 | 2/2003  |
| JP | 2003-086902 | 3/2003  |

OTHER PUBLICATIONS

Translation of JP 08-250801*

* cited by examiner

*Primary Examiner*—James Menefee
(74) *Attorney, Agent, or Firm*—Morrison & Foerster LLP

(57) ABSTRACT

A semiconductor laser element comprising: a clad layer of a first conductivity type; an active layer; a first clad layer of a second conductivity type; a ridge made of a second clad layer of the second conductivity type and a cap layer of the second conductivity type, which are layered on the first clad layer of the second conductivity type, in this order starting from the first clad layer side; a dielectric film formed on ridge sides other than a top portion of the ridge; and a metal electrode layer that covers the ridge, wherein the width of the bottom of the cap layer and the width of the top surface of the second clad layer are approximately equal.

14 Claims, 5 Drawing Sheets

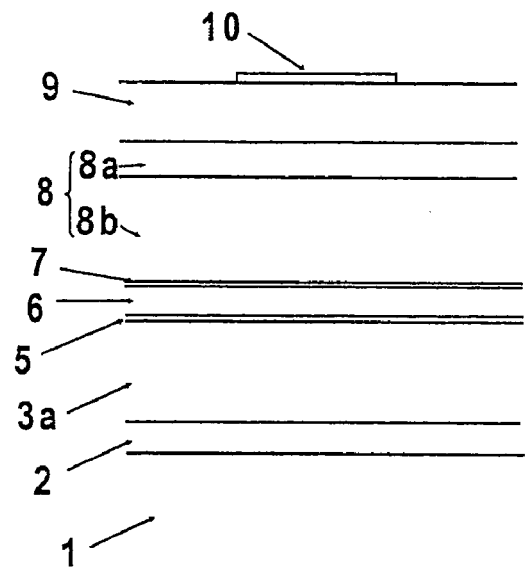
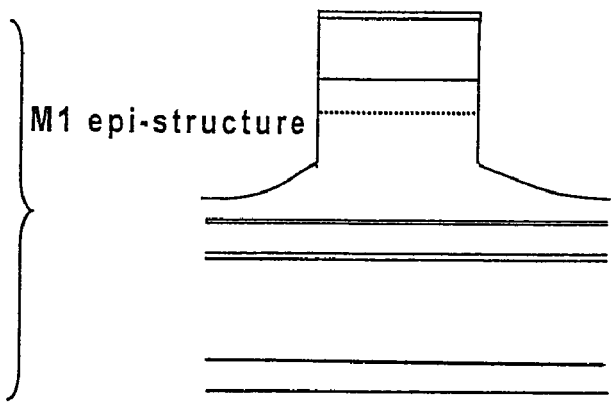
FIG.4A  FIG.4B
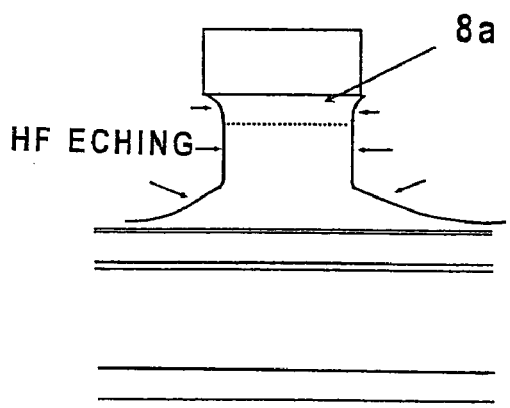
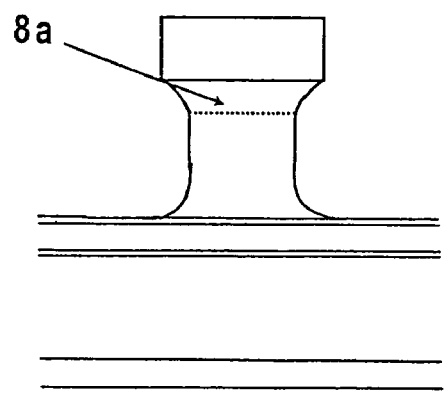
FIG.4C  FIG.4D

SEMICONDUCTOR LASER ELEMENT AND MANUFACTURING METHOD FOR THE SAME

CROSS-REFERENCES TO RELATED APPLICATIONS

This application is related to Japanese applications Nos. 2003-393994 and 2003-399833, filed on Nov. 25, 2003 and Nov. 28, 2003 whose priorities are claimed under 35 USC § 119, the disclosures of which are incorporated by reference in their entirety.

BACKGROUND OF THE INVENTION

1. Field of the Invention

The present invention relates to a semiconductor laser element and a manufacturing method for the same. In particular, the present invention relates to a high power semiconductor laser element that is utilized for a CD-R/RW, a DVD-R/RW and the like, and to a manufacturing method for the same.

Usage of a so-called air ridge structure from among the structures of high power semiconductor lasers has been becoming widespread as a way to reduce the cost of materials and in order to reduce the number of steps in the manufacturing process.

The present invention can provide a semiconductor laser element where the adhesion of the metal electrode layer in the ridge portion has been increased so that the efficiency of heat release and the temperature properties are improved in an air ridge structure.

2. Description of the Background Art

FIGS. 7A to 7D are schematic perspective views showing a manufacturing method for a GaAs/GaAlAs based infrared red laser element according to the prior art.

First, as shown in FIG. 7A, a buffer layer 2, a first N type GaAlAs clad layer 3, a second N type GaAlAs clad layer 4, an active layer 5, a first P type GaAlAs clad layer 6, a GaAs etching stopper layer 7, a second P type GaAlAs clad layer 8, and a P type GaAs cap layer 9 are layered in this order on an N type GaAs substrate (wafer) 1, where each of the layers is grown by means of a vapor deposition method such as MOCVD. Here, though in the figures an individual semiconductor laser element is shown, in practice manufacture is carried out in wafer units.

Next, as shown in FIG. 7B, a mask 10 for the formation of a ridge (current path) is provided on the P type GaAs cap layer 9. A material that is resistant to an etching method used is utilized for the mask. Here, in the case of dry etching, a mask made of a film such as a $SiO_2$ film that is resistant to dry etching, is used as the mask for the formation of a ridge.

Next, as shown in FIG. 7C, the entirety of the P type GaAs cap layer 9 is etched and the second P type GaAlAs clad layer 8 is etched up to the vicinity of the GaAs etching stopper layer 7 by means of a dry etching or wet etching technique so as to create a ridge in rough form (this etching is referred to as first etching). Here, this ridge becomes a current path for laser oscillation.

Subsequently, as shown in FIG. 7D, the second P type GaAlAs clad layer 8 is further etched by HF, which is an etchant that can etch only the second P type GaAlAs clad layer 8 and does not etch GaAs (this etching is referred to as second etching). This etching intend to the width of the ridge so that desired laser properties can be gained. In this case, etching by HF is naturally stopped by the GaAs etching stopper layer 7, and therefore, the width of the ridge depends on the length of the period of time of etching.

Next, a P side electrode is formed in a sequential process shown in FIGS. 8A to 8G. In the following, the process is described in reference to FIGS. 8A to 8G.

First, in order to prevent a current from flowing on the surfaces of both sides of the ridge, first a dielectric film (SiN, $SiO_2$ or the like) 11 having insulating property is formed on the wafer surface, including the entire surface of the ridge, so as to have a thickness of approximately 1,000 Å to 2,000 Å (FIG. 8A). Here, the dielectric film 11 also has the effect of stabilizing NFP (near field pattern) at the time of laser beam emission.

Next, the portion of the cap layer other than the top portion is protected by a resistor 12 (FIG. 8B).

Next, only the dielectric film 11 is etched and removed from the top of the P type GaAs cap layer 9 (FIG. 8C) in order to allow a current to flow through the inside of the ridge only. At this time, the dielectric film 11 on both sides of the P type GaAs cap layer 9 is partially over-etched as shown in FIG. 8C.

Furthermore, a first metal electrode layer 13 is formed of AuZn in order to contact the P type GaAs cap layer 9 to a thick film electrode of gold in an ohmic condition (FIG. 8D).

After this, the resistor 12 is removed (FIG. 8E) and a second metal electrode layer (barrier/die bonding electrode) 14 is formed of Mo/Au (FIG. 8F). At this time, as shown in FIG. 8F, the second metal electrode layer 14 is formed only on the dielectric film 11 on both sides of the P type GaAs cap layer 9. This is because it is difficult for the second metal electrode layer 14 to be formed in the vicinity of the steps (portions directly beneath eaves, i.e. the sides of the top layers) formed between the dielectric film 11 and both sides of the P type GaAs cap layer 9.

Next, a thick film electrode 16 of gold is formed on the wafer surface, including the ridge, by means of plating so as to have a thickness of approximately 2 μm to 3 μm (FIG. 8G). The thick film electrode 16 is formed by means of plating because a current flows from the surface of the second metal electrode layer 14, and thereby, the thick film electrode 16 can be grown with coverage better than by a deposition method.

After this, the N substrate side (bottom side) of the wafer is polished so as to adjust the wafer to have a desired thickness, and then an N side electrode is formed on the N substrate side so that a laser wafer 18, where a number of laser elements are formed as shown in FIG. 9, is completed.

Next, as shown in FIG. 9, the laser wafer 18 is divided into bars 19 having a predetermined width corresponding to the length of the resonator. After this, a protective film having a predetermined reflectance ratio is formed on both edge surfaces for emitting light, and each bar 19 is divided into individual laser elements (chips) (not shown).

Here, a semiconductor laser element that can be gained according to the same method as above is also illustrated in Japanese Unexamined Patent Publication No. 2003-86902.

In addition, a semiconductor laser element that can be gained according to the similar method as above, though it does not have an air ridge structure, is also illustrated in Japanese Unexamined Patent Publication No. HEI 11(1999)-135884.

The P type GaAs cap layer 9 has portions 9' located beneath the P type GaAs cap layers 9 as shown in the above described FIG. 8F, according to the prior art. The lower portions 15 of these portions 9' are behind the top layers at the time of the formation of the second metal electrode layer 14, and therefore, the second metal electrode layer 14 becomes much thinner than other portions or is not formed in the lower portions 15. In this case, it becomes difficult for the thick film electrode 16 to be formed by means of plating on regions where the second metal electrode layer 14 is thin or does not exist, and therefore, cavities 17 occur, as shown in FIG. 8G.

These cavities are air layers, and it becomes difficult for the heat generated at the time of laser oscillation to be released due to these cavities, and thus the temperature properties as well as the reliability of the laser element are deteriorated.

SUMMARY OF THE INVENTION

The present invention provides a semiconductor laser element comprising: a clad layer of a first conductivity type; an active layer; a first clad layer of a second conductivity type; a ridge made of a second clad layer of the second conductivity type and a cap layer of the second conductivity type, which are layered on the first clad layer of the second conductivity type, in this order starting from the first clad layer side; a dielectric film formed on ridge sides other than a top portion of the ridge; and a metal electrode layer that covers the ridge, wherein the width of the bottom of the cap layer of the second conductivity type and the width of the top surface of the second clad layer of the second conductivity type are approximately equal.

Furthermore, the present invention provides a semiconductor laser element comprising: a clad layer of a first conductivity type; an active layer; first clad layer of a second conductivity type; a ridge made of a second clad layer of the second conductivity type and a cap layer of the second conductivity type, which are layered on the first clad layer of the second conductivity type, in this order starting from the first clad layer side; a dielectric film formed on ridge sides other than a top portion of the ridge; and a metal electrode layer that covers the ridge, wherein the second clad layer of the second conductivity type is a layer of which the composition ratio varies in the direction of the thickness.

In addition, the present invention provides a manufacturing method for a semiconductor laser element comprising the steps of: (a) growing an active layer, a first clad layer of a second conductivity type, a second clad layer of the second conductivity type, and a cap layer of the second conductivity type in the above order, on a clad layer of a first conductivity type; (b) etching the cap layer of the second conductivity type and the second clad layer of the second conductivity type so that the width of the bottom of the cap layer of the second conductivity type and the width of the top surface of the second clad layer of the second conductivity type become approximately equal; (c) forming a dielectric film on ridge sides other than a top portion of the ridge; and (d) covering the ridge with a metal electrode layer.

Furthermore, the present invention provides a manufacturing method for a semiconductor laser element comprising the steps of: growing an active layer, a first clad layer of a second conductivity type, a second clad layer of the second conductivity type composed of plural elements and varied a composition ratio of elements and a cap layer of the second conductivity type in the above order, on a clad layer of a first conductivity type; dry etching the cap layer and the second clad layer, followed by wet etching by means of an etchant that includes HF; forming a dielectric film on ridge sides other than a top portion of the ridge; and covering the ridge with a metal electrode layer.

These and other objects of the present application will become more readily apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

FIGS. 4A to 4D are enlarged views of an essential part in a semiconductor laser element according to Embodiment 3;

DETAILED DESCRIPTION OF THE PREFERRED EMBODIMENTS

Figure 1:
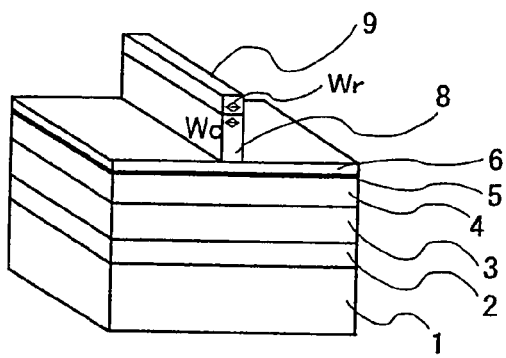
FIG. 1 is a schematic perspective view showing a semiconductor laser element according to the present invention.

In the present specification, a first conductivity type indicates N type or P type. On the other hand, a second conductivity type indicates P type in the case where the first conductivity type is N type, and indicates N type in the case where the first conductivity type is P type. Though in the following descriptions, the first conductivity is N type, it may of course be P type.

First, the semiconductor laser element of the present invention is at least provided with a first P type clad layer, a second P type clad layer and a P type cap layer. The materials that form each of these layers are not particularly limited, but rather any known materials can be utilized. For example, GaAlAs/GaAs, InGaAsP/GaAs, AlGaInP/GaP, InGaP/GaAs, AlGaInP/GaAs, GaAsSb/GaAs and the like can be cited as combinations of materials that form the first and second P type clad layers as well as the P type cap layer.

It is preferable for the second P type clad layer to compose of plural elements and to be made of a layer of which the composition ratio (ratio of mixed crystal) varies in the direction of the thickness. For example, it is preferable for the second P type clad layer to include at least one element that is different from those forming the P type cap layer, and the composition ratio varies in such a manner that the ratio of this different element becomes smaller, the region that the second P type clod layer makes contact with the P type cap layer, the region becomes closer to the P type cap layer. In addition, it is preferable for the variation of the composition ratio to be sequential, and it is more preferable for this variation to be linear.

Concretely speaking, in the case where the second P type clad layer is a P type GaAlAs layer and the P type cap layer is a P type GaAs layer, it is preferable for Al to be included in such a manner that the composition ratio corresponding to total amount of Al and Ga varies with a difference of 0.1 or less in a region within ⅓ from the top (more preferably in a region between ½ and ¼ from the top) in the direction of the thickness of the second P type clad layer. It is more preferable for the difference in the composition ratio to be 0.05 or less. Furthermore, it is preferable for the portion that makes contact with the P type cap layer to have the Al composition ratio corresponding to total amount of Al and Ga in the range of 0.38 to 0.46 and to have the lowest Al composition ratio in the second P type clad layer. The more preferable Al composition ratio is 0.42.

Furthermore, Se, Te, Si, Ge, C and the like can be cited as impurities that provide N type to each layer forming the semiconductor laser element, while Zn, C and the like can be cited as impurities that provide P type. Here, C can be utilized as an impurity that provides either P type or N type depending on the conditions. The film thickness and the impurity concentration of each layer can be appropriately determined depending on the compatibility between the layers and the desired functions of the semiconductor laser.

The semiconductor laser according to the present invention may have an active layer beneath the P type clad layer, a current block layer for controlling the current that flows into the active layer in the P type cap layer, a light guide layer between the active layer and the P type clad layer, an N type clad layer beneath the active layer, a buffer layer beneath the N type clad layer, and an etching stopper layer between the first and second P type clad layers, in addition to the above described P type clad layer and P type cap layer. The materials that form each of these layers can appropriately be selected in accordance with the materials utilized for the first and second P type clad layers and the P type cap layer.

The thickness of the first P type clad layer after the etching can be precisely controlled by having the etching stopper layer (for example GaAs layer). As a result of this precise control, the angle of laser radiation can also be controlled.

Furthermore, each of the above described layers is conventionally formed on a substrate. Any of the well known substrates can be utilized for the substrate and, for example, a GaAs substrate, an Si substrate, a glass substrate, a sapphire substrate and the like can be cited. The substrate may have either conductivity type, N type or P type.

Here, each of the above described layers formed on the substrate can be layered according to a well known method such as an MOCVD method, an MBE method, an LPE method, an evaporation method, a spattering method or the like.

In addition, according to the present invention, the second P type clad layer and the P type cap layer, which are layered on the first P type clad layer, form a ridge. The ridge has a predetermined width in the direction perpendicular to the resonator length, and extends in the direction of the resonator length.

In addition, the width of the bottom of the P type cap layer and the width of the top surface of the second P type clad layer are approximately equal. Here, being approximately equal includes a case where the widths of both layers are close to each other to such a degree that cavities formed beneath the P type cap layer between the sides of the ridge and the below described thick film electrode become small enough not to affect the reliability of the laser device, in addition to the case where the widths of both layers are completely equal. Concretely speaking, it is preferable for the difference between the width of the bottom of the P type cap layer and the width of the top surface of the above described second P clad layer to be in the range of +0.4 μm to −0.4 μm. More preferably, the difference is in the range of +0.2 μm to −0.2 μm.

The following methods can be cited as a method for forming the ridge.

(A) A method can be cited wherein a mask for forming the ridge is formed on the P type cap layer, and the P type cap layer and the second P type clad are sequentially etched by using this mask, and then the P type cap layer is etched with a priority. According to the latter etching, eaves of the P type cap layer (i.e. the portions beneath the P type cap layer) can be made smaller. The etching method may be either a wet etching method or a dry etching method. In addition, the etchant that is utilized for the etching can be appropriately selected in accordance with the materials of the P type cap layer and the second P type clad layer.

(B) The following method can be cited in the case where the second P type clad layer is formed of a layer of which the composition ratio varies in the direction of the thickness.

That is to say, a mask for forming the ridge is formed on the P type cap layer, and the P type cap layer and the second P type clad layer are sequentially etched by using this mask, and then the P type cap layer is etched with a priority so that the ridge can be formed. According to the latter etching, the portions beneath the P type cap layer can be made smaller. The former etching method may be either a wet etching method or a dry etching method. It is preferable for the latter etching method to be a wet etching method. In addition, the etchant utilized for the etching can be appropriately selected in accordance with the materials for the P type cap layer and the second P type clad layer. In particular, in the case where the latter etching method is a wet etching method, the etching rate of the second P type clad layer may vary in the direction of the thickness due to the variation of the composition ratio in the direction of the thickness. In addition, in the case where the variation in the composition ratio is sequential or linear, the form of the second P type clad layer after the etching has sequential or linear smooth variation. In particular, the linear variation provides the optimal form of the ridge of which the width varies in a manner that is not too dramatic or too gradual, and as a result, it becomes possible to rectify the problem with the metal electrode layer being formed beneath the top layers.

Furthermore, in the case where the second P type clad layer is a P type GaAlAs layer, the P type cap layer is a P type GaAs layer, and Al is included in the region within ⅓ of the upper portion (more preferably the region from ½ to ¼ from the top) in the direction of the thickness of the second P type clad layer in such a manner that the composition ratio varies by 0.1 or less, the width of the top portion of the second P type clad layer can be made close to the width of the P type cap layer. Therefore, cavities created in the portions beneath the P type cap layer can be made smaller. Here, in the case where the region where the Al composition ratio varies is greater than ⅓, the portion which is close to the active layer negatively affects the near field pattern of the laser beam, making the near field pattern unstable, and therefore, this case is not preferable.

In addition, in the case where the variation of the composition ratio is 0.05 or less, the cavities can be made even smaller. Furthermore, when the second P type clad layer is a layer where the portion that makes contact with the P type cap layer has the Al composition ratio which is the lowest, ranging from 0.38 to 0.46 in comparison with the other portions, the cavities can be made even smaller. In the case where the Al composition ratio is lower than 0.38, the wet etching by means of, for example, HF becomes unstable, causing the sides of the ridge to have irregular forms and limiting the progress of the etching by means of HF to almost zero, and therefore, this case is not preferable.

The low etching rate of the layer having a low Al composition ratio and the decrease of the Al composition ratio relative to its position, starting from the second P type clad layer toward the P type cap layer, are utilized so as to improve the conditions of the portions beneath the top layers as follows.

Here, it is preferable for the width of the second P type clad layer that forms the ridge to be wider in the upper edge than in the lower edge and is wider in the region of which the composition ratio varies in the above described second P type clad layer. In such a configuration, cavities created in the portions beneath the P type cap layer can be made smaller. Here, it is preferable for the width of the upper edge of the second P type clad layer to be the same as or as close as possible to the width of the lower edge of the P type cap layer. Furthermore, it is preferable for the width of the upper edge of the second P type clad layer to be 1.1 to 1.5 times greater than the width of the lower edge of this layer.

A dielectric film is formed on the ridge sides other than the top portion of the ridge. This dielectric film has a current narrowing function for preventing a current from flowing through the portions other than the ridge. Though the material of this dielectric film is not particularly limited, a semiconductor film such as Si or an insulating film such as SiN or $SiO_2$ is preferable. A Si film has a high adhesiveness to the AlGaAs clad layer, making NFP and FFP (far field pattern) of the laser beam stable. An SiN film has a large thermal expansion coefficient in comparison with an $SiO_2$ film, and this thermal expansion coefficient is close to that of the GaAlAs clad layer, and therefore, it becomes difficult for a stress distortion to occur in the ridge portion, leading to an increase in the reliability. The thickness of the electric film is usually in the range of 0.1 μm to 0.4 μm and preferably in the range of 0.15 μm to 0.25 μm. In addition, for example, a CVD method, a spattering method, a plasma CVD method or the like can be cited as the method for forming the dielectric film. A plasma CVD method allows the formed dielectric film to cover the portions beneath the top layers without gaps exhibiting good coverage.

It is preferable for this dielectric film to have an index of refraction in the range of 1.4 to 2.2 and a film thickness in the range of 1,000 Å to 4,000 Å (or 3,000 Å). The dielectric film has an index of refraction in such a specific range, and thereby, the difference in the index of refraction between the outside and the inside of the ridge can be increased. As a result, a light containment effect can be gained at the time of laser light emission. In particular, it is preferable to utilize a dielectric film in the above described specific range, in order to stabilize the near field pattern at the time of the laser light emission. Here, the above described specific range is set because a thick film is good in gaining the light containment effect, while thermal conduction becomes poor in the case where the film becomes too thick.

The ridge is covered with a metal electrode layer. A layer made of a known material can be utilized as this metal electrode layer and, for example, a metal layer such as Al or Cu or a layered body such as Mo/Au, Cr/Au, Mo/Au or Au/Zn can be cited. Here, a region which is not covered with the above described dielectric film or metal electrode layer may exist on the surface of the ridge depending on the formation of the ridge. The metal electrode layer has the function of making a drive current flow through the semiconductor laser element, as well as the function of releasing the heat generated at the time of light emission. In addition, the metal electrode layer is formed by means of plating, and thereby, a thick metal layer can be formed, further improving the efficiency of heat release.

In addition, a metal layer may be placed on the top portion of the ridge in order to connect the P type cap layer to the metal electrode layer in an ohmic condition. AuZn, AuBe or the like can be cited as an example of such a metal layer. For example, a deposition method, a CVD method or a spattering method can be cited as a method for forming the metal electrode layer and the metal layer. From among these methods, the spattering method allows for an improvement in the coverage in comparison with the evaporation method, and therefore, eliminating cavities beneath the metal electrode layer in the portions that make up the sides of the ridge.

Furthermore, a thick film electrode is usually formed on the entire surface, including the ridge covered with the metal electrode layer. This thick film electrode has a thickness ranging from approximately 2 μm to 3 μm and is made of Au, Mo/Au or the like.

In the above described semiconductor laser element according to the present invention, the volume of the cavities that exist on the sides of the ridge can be reduced by approximately 50% or more, or by approximately 90% or more in comparison with the prior art. Therefore, an effect can be gained where deterioration in the temperature properties and reduction in the reliability resulting from the cavities can be suppressed.

Figure 9:
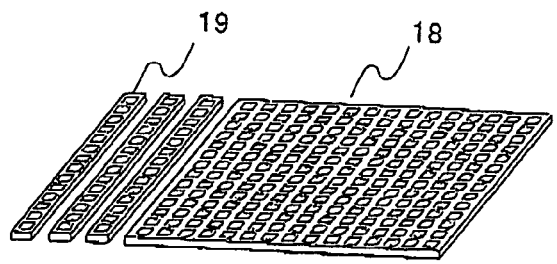
FIG. 9 is schematic perspective view showing a manufacturing method for a semiconductor laser element.

Here, conventionally, a number of semiconductor laser elements are simultaneously formed on wafer 18, as shown in FIG. 9, and after the formation of each of the above described components, the wafer is divided into bars 19 having a width of the resonator length. After this, a protective film having a predetermined reflectance ratio is formed on both edge surfaces for light emission, and then, each bar 19 is divided into individual laser element (chips).

EMBODIMENTS

In the following, the embodiments according to the present invention are described in further detail, though the present invention is not limited to the following embodiments.

Embodiment 1

FIG. 1 is a schematic perspective view showing a semiconductor laser element according to the present invention.

A manufacturing method for the semiconductor laser element in FIG. 1 is described below in reference to FIGS. 7A to 7D.

Figure 7A:
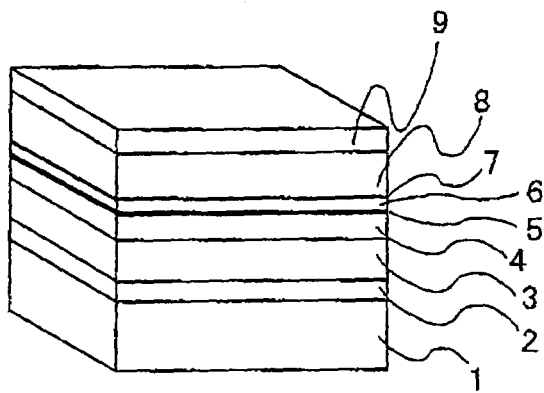
FIGS. 7A to 7D are schematic perspective views showing a manufacturing method for a semiconductor laser element.

First, as shown in FIG. 7A, a buffer layer 2, a first N type GaAlAs clad layer 3, a second N type GaAlAs clad layer 4, an active layer 5, a first P type GaAlAs clad layer 6, a GaAs etching stopper layer 7, a second P type GaAlAs clad layer 8, and a P type GaAs cap layer 9 are layered in this order on an N type GaAs substrate (wafer) 1, wherein each layer is grown according to a vapor deposition method such as MOCVD. Here, though in the figure, an individual semiconductor laser element is shown, practical manufacture is carried out in wafer units.

Figure 7B:
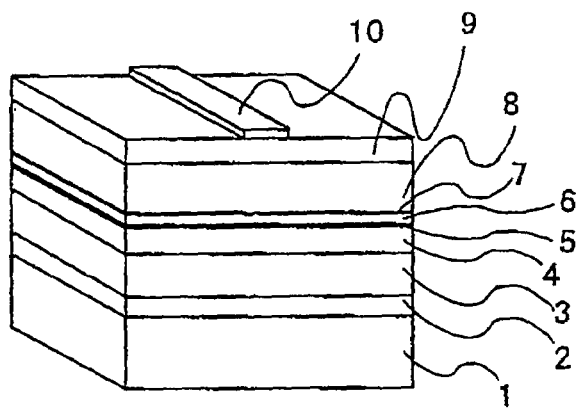

Next, as shown in FIG. 7B, a mask 10 for forming a ridge (current path) is provided on the P type GaAa cap layer 9. A material that is resistant to the used etching method is utilized for the mask. Here, in the case of dry etching, a mask made of a film that is resistant to dry etching such as a $SiO_2$ film is, for example, used as the mask for forming a ridge.

Figure 7C:
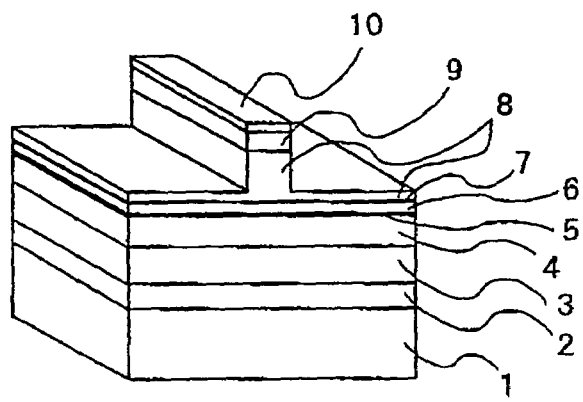

Next, as shown in FIG. 7C, the entirety of the P type GaAs cap layer 9 is etched, and the second P type GaAlAs clad layer 8 is etched up to the vicinity of the GaAs etching stopper layer 7 by means of a technique such as dry etching or wet etching, and thereby, a ridge in rough form is created (this etching is referred to as first etching). Here, this ridge becomes a current path for laser oscillation.

Figure 7D:
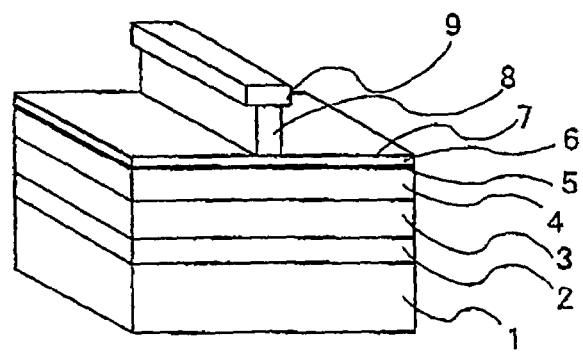
Figure 8A:
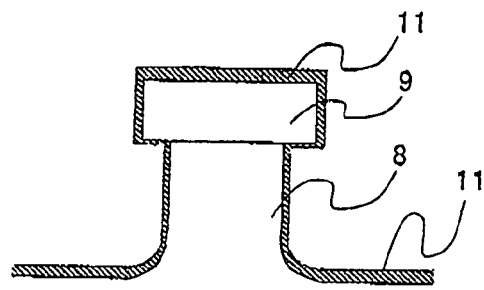
FIGS. 8A to 8G are schematic perspective views showing a manufacturing method for a P side electrode of a semiconductor laser element according to the prior art.
Figure 8B:
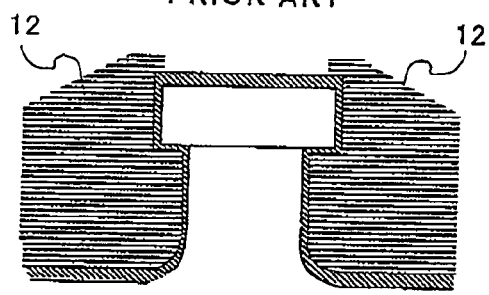
Figure 8C:
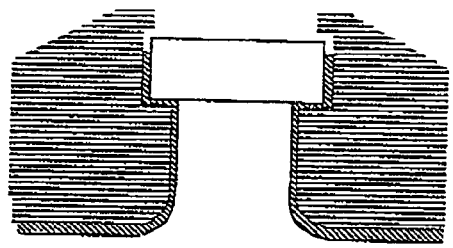
Figure 8D:
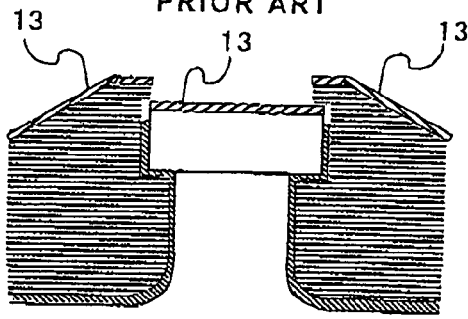
Figure 8E:
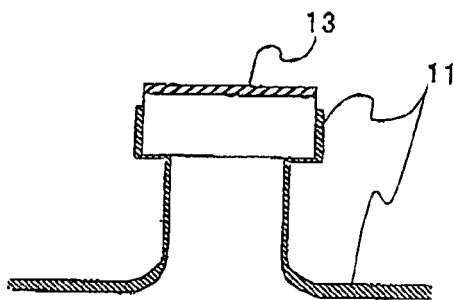
Figure 8F:
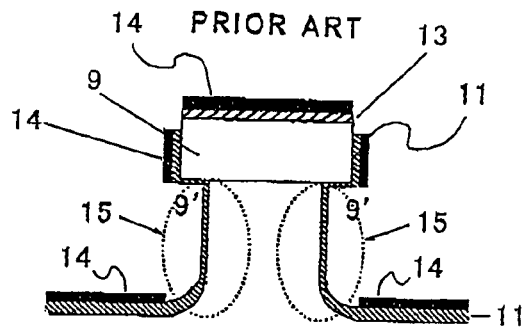
Figure 8G:
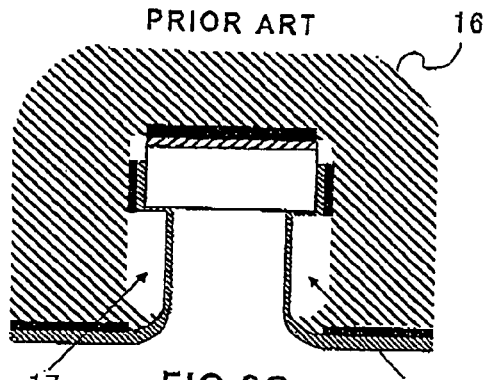

Subsequently, as shown in FIG. 7D, the second P type GaAlAs clad layer 8 is further etched using HF, which is an etchant that can etch only the second P type GaAlAs clad layer 8, and that does not etch GaAs (this etching is referred to as second etching). As a result of this etching, the width of the ridge is adjusted so that desired laser properties are gained. In this case, etching using HF is naturally stopped at the GaAs etching stopper layer 7, and therefore, the width of the ridge depends on the length of the period of time of etching using HF.

After the completion of the second etching, further etching is subsequently carried out on the P type GaAs cap layer 9 using an ammonium based etchant that can etch only GaAs, and thereby, the semiconductor laser element in FIG. 1 is gained.

Figure 2A:
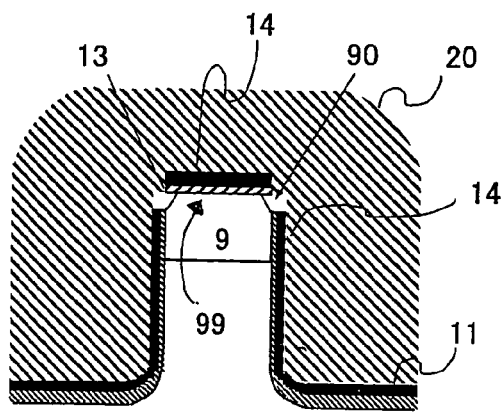
FIGS. 2A and 2B are enlarged views of an essential part in a semiconductor laser element according to Embodiment 1.

The above described etching is carried out for a period of time that is long enough only to remove the protruding portions of the P type GaAs cap layer 9. Concretely speaking, etching is carried out to the extent wherein width Wc of the lower portion of the P type GaAs cap layer 9 becomes equal to or slightly greater than width Wr of the upper portion of the second P type GaAlAs clad layer 8 directly beneath the P type GaAs cap layer. Concretely speaking, it is desirable to establish a relationship of $-0.4\ \mu m \leq (Wr-Wc) \leq 0.4\ \mu m$. In particular, the effects of the present invention are maximized when Wr−Wc is equal to 0 μm, and in this case, the ridge does not have any protrusions at the top, and thereby, the second metal electrode layer of Mo/Au can be formed on approximately the entirety of the ridge, as shown in FIG. 2A. Therefore, a thick film electrode 20, which is formed by means of gold plating after this, covers the entirety of the wafer, including the ridges, with almost no gaps (no cavities).

Here, as a result of etching of protrusions of the P type GaAs cap layer 9, the GaAs etching stopper layer 7 shown in FIG. 7D disappears. However, the fist P type GaAlAs clad layer 6 is positioned directly beneath the GaAs etching stopper layer 7, and this first P type GaAlAs clad layer 6 is not etched. Thereby, the oscillation of the laser element is not affected.

In addition, as shown in FIG. 2A, there are portions on both sides of the P type GaAs cap layer 9 that do not have the dielectric film 11 or the second metal electrode layer 14 of Mo/Au. These portions are etched by the plating liquid at the time of the formation of the thick film electrode 20 by means of gold plating so as to partially create etched portions 90 in the P type GaAs cap layer 9. As a result of this, though the area of the contact portion 99 between the ridge and the first metal electrode layer 13 becomes slightly smaller, an increase in the resistance of the element and an increase in the operation voltage can be ignored within the range where the relationship, $-0.4\ \mu m \leq (Wr-Wc) \leq 0.4\ \mu m$ is established.

Figure 2B:
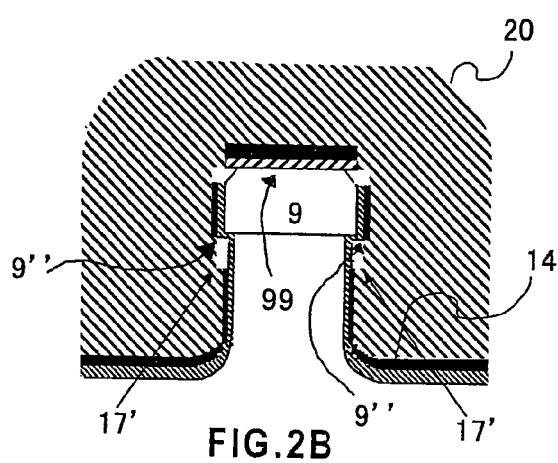

Here, in the case of $0\ \mu m < (Wr-Wc) \leq 0.4\ \mu m$, as shown in FIG. 2B, protrusions 9''' (then length of one protrusion is approximately 0.2 μm or less in this case) remains slightly on the ridge. However, this length of the protrusions becomes approximately half or less of the length of the protrusions (approximately 0.4 μm each) according to the prior art, and the areas of portions beneath the protrusions become smaller. Therefore, as shown in FIG. 2B, the second metal electrode layer 14 of Mo/Au can be formed on the portions approximately directly beneath the protrusions 9'''. Accordingly, cavities 17', which occur after the formation of the thick film electrode 20 by means of gold plating, are much more microscopic in comparison with the cavities which occur according to the prior art, and sufficient heat releasing effects can be secured in comparison with the prior art.

Here, in this case, though the etched portions 90 are created in the P type GaAs cap layer 9 in the same manner as in FIG. 2A, the area of the contact portion 99 between the ridge and the first metal electrode layer 13 is sufficiently secured in comparison with the case shown in FIG. 2A, and therefore, no problems arise concerning an increase in the resistance of the element or an increase in the operation voltage.

In addition, in the case of $0.4\ \mu m > (Wr-Wc)$, no protrusions remain, and cavities 17' do not occur after the formation of the thick film electrode 20 by means of gold plating. However, the area of the contact portion 99 between the ridge and the first metal electrode layer 13 is reduced to a great degree, and therefore, it is not preferable from the point of view of an increase in the resistance of the element and from the point of view of an increase in the operation voltage.

Accordingly, as described above, it is desirable for the relationship between width Wc of the lower portion of the P type GaAs cap layer 9 and width Wr of the upper portion of the second P type GaAlAs clad layer 8 directly beneath the P type GaAs cap layer to be $-0.4\ \mu m \leq (Wr-Wc) \leq 0.4\ \mu m$. In particular, more preferable range of the above described relationship is $-0.2\ \mu m \leq (Wr-Wc) \leq 0.2\ \mu m$.

Here, the formation of the P side electrode is carried out according to the following method.

First, a dielectric film (SiN or $SiO_2$) 11 having insulating properties is formed on the wafer surface, including the entirety of the ridges, so as to have a thickness of approximately 1,000 Å to 2,000 Å in order to prevent a current from flowing through the surfaces of on both sides of the ridges.

Next, the portions other than the top portion of the P type GaAs cap layer 9 are protected by a resist.

Subsequently, only the dielectric film 11 on the upper portion of the P type GaAs cap layer 9 is etched and removed so that a current flows only through the inside of the ridge. At this time, portions of the dielectric film 11 on both sides of the P type GaAs cap layer 9 are over-etched.

Furthermore, the first metal electrode layer 13 of AuZn is formed in order to contact the P type GaAs cap layer 9 to the thick film electrode of gold in an ohmic condition.

After this, the resist is removed, then the second metal electrode layer (barrier/die bonding electrode) 14 of Mo/Au form on the wafer surface.

Next, the thick film electrode 20 of gold is formed on the wafer surface, including the ridge, by means of plating so as to have a thickness of approximately 2 μm to 3 μm.

Embodiment 2

Figure 3:
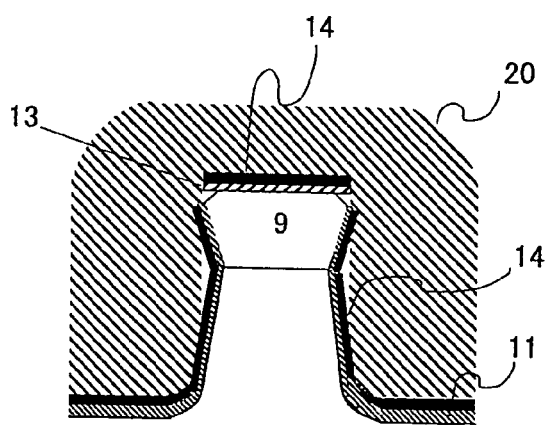
FIG. 3 is an enlarged view of an essential part in a semiconductor laser element according to Embodiment 2.

FIG. 3 is a schematic perspective view showing a semiconductor laser element according to Embodiment 2.

Embodiment 2 is an example in the case where the first etching and the second etching for forming the ridge are both wet etching.

In Embodiment 2, a semiconductor laser element is manufactured in the same manner as in Embodiment 1, except that the mask for forming the ridge is a resist mask, and the first etching is wet etching using sulfuric acid based etchant.

In Embodiment 2, the first etching is wet etching, and therefore, the P type. GaAs cap layer 9 is completed in a form having a slight angle, as shown in FIG. 3. In Embodiment 2, it is desirable for the relationship between width Wc of the lower portion of the P type GaAs cap layer and width Wr of the upper portion of the second P type GaAlAs clad layer directly beneath the P type GaAs cap layer to be $-0.4$ $\mu m \leq (Wr-Wc) \leq 0.4$ $\mu m$ in the same manner as in Embodiment 1.

Embodiment 3

The manufacturing method for a semiconductor laser element according to Embodiment 3 is described below in reference to FIGS. 4A to 4D as well as 5A and 5B.

First, as shown in FIG. 4A, a buffer layer 2, an N type GaAlAs clad layer 3a, an active layer 5, a first P type GaAlAs clad layer (having an Al composition ratio of 0.5) 6, a GaAs etching stopper layer 7, a second P type GaAlAs clad layer 8, and a P type GaAs cap layer (having a thickness of 0.75 $\mu m$) 9 are layered on an N type GaAs substrate (wafer) 1 in this order, where each layer is grown according to a vapor deposition method such as MOCVD. Here, though the figure shows an individual semiconductor laser element, in practice, manufacture is carried out in wafer units.

The above described second P type GaAlAs clad layer 8 is formed in a manner where the thickness thereof is 0.13 $\mu m$ and the Al composition ratio is 0.5 in a portion 8a which is 1 $\mu m$ away from the first P type GaAlAs clad layer 6, and the Al composition ratio sequentially changes in the range of 0.47 and 0.42 in the remaining portion 8b.

Next, a mask 10 for forming a ridge (current path) is provided on the P type GaAs cap layer 9. A material resistant to the used etching method is utilized for the mask. Here, in the case of dry etching, a mask made of a film resistant to dry etching, such as a $SiO_2$ film, is used as the mask for forming the ridge.

Next, as shown in FIG. 4B, the entirety of the P type GaAs cap layer 9 is etched and the second P type GaAlAs clad layer 8 is etched up to the vicinity of the GaAs etching stopper layer 7 by means of a dry etching or wet etching technique so as to create a ridge in rough form (this etching is referred to as first etching). Here, this ridge becomes a current path for laser oscillation.

Subsequently, as shown in FIGS. 4C and 4D, the second P type GaAlAs clad layer 8 is further etched by HF, which is an etchant that can etch only the second P type GaAlAs clad layer 8 and does not etch GaAs (this etching is referred to as second etching). As a result of this etching, the second P type GaAlAs clad layer 8, which has a low Al composition ratio, becomes of the form shown in FIG. 4D due to its low etching rate.

Next, a dielectric film (SiN or $SiO_2$) 11 having insulating properties is formed on the wafer surface, including the entirety of the ridges, so as to have a thickness of approximately 1,000 Å to 2,000 Å in order to prevent a current from flowing through the surfaces of on both sides of the ridges. Next, the portions other than the top portion of the P type GaAs cap layer 9 are protected by a resist. Subsequently, only the dielectric film 11 on the upper portion of the P type GaAs cap layer 9 is etched and removed so that a current flows only through the inside of the ridge. At this time, portions of the dielectric film 11 on both sides of the P type GaAs cap layer 9 are over-etched. Furthermore, the first metal electrode layer 13 of AuZn is formed in order to contact the P type GaAs cap layer 9 to the thick film electrode of gold in an ohmic condition. After this, the resist is removed, then the second metal electrode layer (barrier/die bonding electrode) 14 of Mo/Au is formed by means of plating on the wafer surface (FIG. 5A).

Figure 5A:
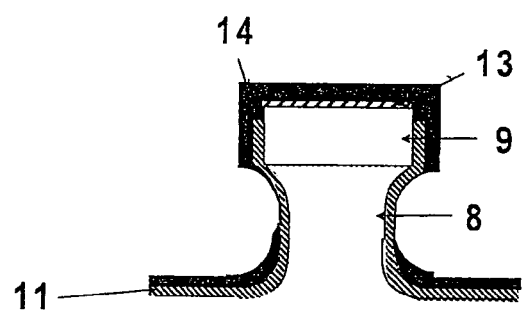
FIGS. 5A and 5B are schematic views of the periphery of the cap layer in a semiconductor laser element according to Embodiment 3.

In the present embodiment, the protrusions are smoothly formed so that the first metal electrode layer is formed even to extend to the portions beneath the protrusions, and therefore, a current flows to the portions beneath the protrusions from the surface of the first metal electrode layer at the time of plating, and as a result, the formation of the second metal electrode layer is improved so as to be formed on the portions beneath the protrusions (FIG. 5A).

Figure 5B:
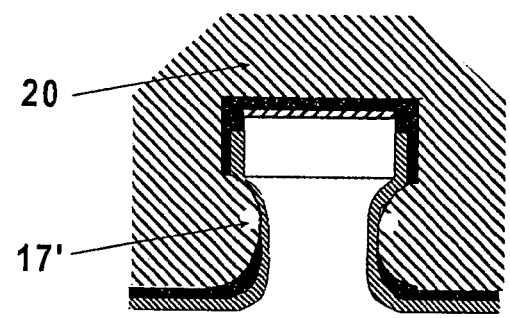

Next, a thick film electrode 20 of gold is formed on the wafer surface, including the ridge, by means of plating so as to have a thickness of approximately 2 $\mu m$ to 3 $\mu m$ (FIG. 5B).

According to Embodiment 3, the volume of cavities 16 forming the sides of the ridge is smaller than that of the prior art shown in FIG. 7G.

Embodiment 4

Figure 6A:
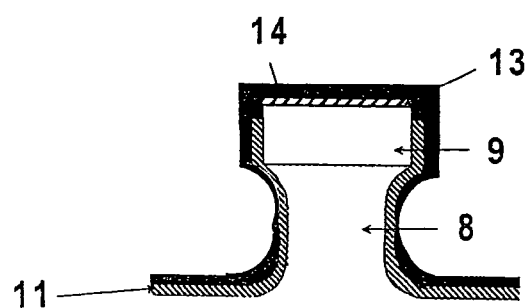
FIGS. 6A and 6B are enlarged views of an essential part in a semiconductor laser element according to Embodiment 4.
Figure 6B:
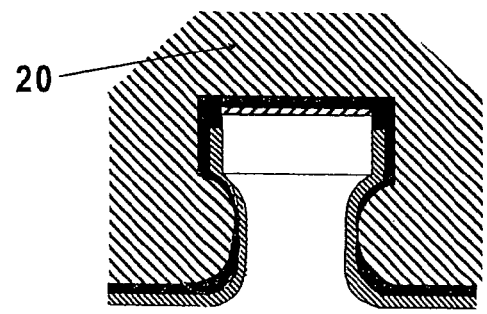

A semiconductor laser element according to this embodiment is formed in the same manner as in Embodiment 3, except that the second metal electrode layer 14 is layered by means of spattering (FIGS. 6A and 6B). In Embodiment 4, the cavities forming the sides of the ridge can be eliminated.

According to the present invention, the width of the protrusions made of the cap layer can be made smaller than that of the prior art, and therefore, the cavities on the sides of the ridge that occur after the formation of the thick film electrode can be reduced. As a result, the heat generated at the time of laser oscillation becomes easy to be released, and a laser element of which the laser properties and the reliability are increased can be gained. In particular, according to the present invention, a high power semiconductor laser element having an air ridge structure can be gained.

What is claimed is:

1. A semiconductor laser element comprising:
a clad layer of a first conductivity type; an active layer; a first clad layer of a second conductivity type; a ridge made of a second clad layer of the second conductivity type and a cap layer of the second conductivity type, which are layered on the first clad layer of the second conductivity type, in this order starting from the first clad layer side; a dielectric film formed on ridge sides other than a top portion of the ridge; and a metal electrode layer that covers the ridge, wherein the width of the bottom of the cap layer and the width of the top surface of the second clad layer are approximately equal;
wherein the second clad layer is a P type GaAlAs layer and the cap layer is a P type GaAs layer; and
Al in the second clad layer is included in such a manner that an Al composition ratio corresponding to total amount of Al and Ga varies with a difference of 0.1 or less in a region within ⅓ from the top in the direction of the thickness of the second clad layer.

2. A semiconductor laser element comprising: a clad layer of a first conductivity type; an active layer; a first clad layer of a second conductivity type; a ridge made of a second clad layer of the second conductivity type and a cap layer of the second conductivity type, which are layered on the first clad layer of the second conductivity type, in this order starting from the first clad layer side; a dielectric film formed on ridge sides other than a top portion of the ridge; and a metal electrode layer that covers the ridge, wherein the width of the bottom of the cap layer and the width of the top surface of the second clad layer are approximately equal;

wherein the second clad layer is a P type GaAlAs layer and varies a composition ratio of elements in the direction of the thickness and the cap layer is a P type GaAs layer;

wherein a portion of the second clad layer in contact with the cap layer has an Al composition ratio corresponding to total amount of Al and Ga in the range of 0.38 to 0.46 and has the lowest Al composition ratio in the second clad layer.

3. A semiconductor laser element according to either claim 1 or claim 2, in which the difference between the width of the bottom of the cap layer and the width of the top surface of the second clad layer is in the range of +0.4 µm to −0.4 µm.

4. A semiconductor laser element according to either claim 1 or claim 2 further comprising a thick film electrode of gold formed so as to cover the entirety of the ridge provided the metal electrode layer.

5. A semiconductor laser element according to either claim 1 or claim 2, in which the second clad layer includes at least one element that is different from those forming the cap layer, and the element becomes smaller in amount in the region that the second clad layer makes contact with the cap layer, and in the direction of the cap layer.

6. A semiconductor laser element according to either claim 1 or claim 2, in which the composition ratio of the second clad layer is varied sequentially.

7. A semiconductor laser element according to claim 6, in which the composition ratio is varied linearly in the direction of the thickness of the second clad layer.

8. A semiconductor laser element according to either claim 1 or claim 2, in which the second clad layer is wider in an upper edge than in a lower edge and is wider in the region of which the composition ratio varies in the second clad layer.

9. A semiconductor laser element according to either claim 1 or claim 2 further comprising an etching stopper layer provided between the first clad layer and the second clad layer.

10. A semiconductor laser element according to claim 9, in which the etching stopper layer is a GaAs layer.

11. A semiconductor laser element according to either claim 1 or claim 2, in which the dielectric film has an index of refraction in the range of 1.4 to 2.2 and a film thickness in the range of 1,000 Å to 3,000 Å.

12. A semiconductor laser element according to claim 11, in which the dielectric film is a $SiO_2$ film or a SiN film.

13. A semiconductor laser element comprising: a clad layer of a first conductivity type; an active layer; first clad layer of a second conductivity type; a ridge made of a second clad layer of the second conductivity type and a cap layer of the second conductivity type, which are layered on the first clad layer of the second conductivity type, in this order starting from the first clad layer side; a dielectric film formed on ridge sides other than a top portion of the ridge; and a metal electrode layer that covers the ridge, wherein the second clad layer is a layer of which the composition ratio varies in the direction of the thickness;

wherein the second clad layer is a P type GaAlAs layer and the cap layer is a P type GaAs layer; and Al in the second clad layer is included in such a manner that an Al composition ratio corresponding to total amount of Al and Ga varies with a difference of 0.1 or less in a region within ⅓ from the top in the direction of the thickness of the second clad layer.

14. A semiconductor laser element comprising: a clad layer of a first conductivity type; an active layer; first clad layer of a second conductivity type; a ridge made of a second clad layer of the second conductivity type and a cap layer of the second conductivity type, which are layered on the first clad layer of the second conductivity type, in this order starting from the first clad layer side; a dielectric film formed on ridge sides other than a top portion of the ridge; and a metal electrode layer that covers the ridge, wherein the second clad layer is a layer of which the composition ratio varies in the direction of the thickness;

wherein the second clad layer is a P type GaAlAs layer and varies a composition ratio of elements in the direction of the thickness and the cap layer is a P type GaAs layer; and wherein a portion of the second clad layer in contact with the cap layer has an Al composition ratio corresponding to total amount of Al and Ga in the range of 0.31 to 0.46 and has the lowest Al composition ratio in the second clad layer.

* * * * *